(12) United States Patent
Wilson (10) Patent No.: US 8,719,629 B2
(45) Date of Patent: May 6, 2014

(54) SYSTEMS, METHODS AND DEVICES FOR CONTROLLING BACKUP POWER PROVIDED TO MEMORY DEVICES AND USED FOR STORING OF SENSITIVE DATA

(75) Inventor: Dean Clark Wilson, Lonsdale, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/552,402

(22) Filed: Jul. 18, 2012

(65) Prior Publication Data

US 2012/0284561 A1    Nov. 8, 2012

Related U.S. Application Data

(63) Continuation of application No. 12/632,556, filed on Dec. 7, 2009, now Pat. No. 8,230,257.

(60) Provisional application No. 61/220,862, filed on Jun. 26, 2009.

(51) Int. Cl.
*G06F 11/00* (2006.01)
(52) U.S. Cl.
USPC ............................................................ 714/14
(58) Field of Classification Search
USPC ............................................ 714/14; 713/300
See application file for complete search history.

(56) References Cited

U.S. PATENT DOCUMENTS

| 4,510,400 | A  | 4/1985  | Kiteley         |
|-----------|----|---------|-----------------|
| 5,367,489 | A  | 11/1994 | Park et al.     |
| 5,459,850 | A  | 10/1995 | Clay et al.     |
| 5,483,486 | A  | 1/1996  | Javanifard et al.|
| 5,497,119 | A  | 3/1996  | Tedrow et al.   |
| 5,537,360 | A  | 7/1996  | Jones et al.    |
| 5,546,042 | A  | 8/1996  | Tedrow et al.   |
| 5,567,993 | A  | 10/1996 | Jones et al.    |
| 5,592,420 | A  | 1/1997  | Cernea et al.   |
| 5,914,542 | A  | 6/1999  | Weimer et al.   |
| 5,959,926 | A  | 9/1999  | Jones et al.    |
| 6,091,617 | A  | 7/2000  | Moran           |
| 6,404,647 | B1 | 6/2002  | Minne'          |
| 6,567,261 | B2 | 5/2003  | Kanouda et al.  |
| 6,700,352 | B1 | 3/2004  | Elliott et al.  |

(Continued)

OTHER PUBLICATIONS

National Semiconductor, 2000, "DS007746", "LM78XX Series Voltage Regulators".*

(Continued)

*Primary Examiner* — Yair Leibovich
(74) *Attorney, Agent, or Firm* — Crawford Maunu PLLC (57) ABSTRACT

Power-backup capabilities are provided by implementing a variety of different methods, systems and devices. According to one such implementation, a solid-state memory device is implemented with a primary power source that provides primary power. A secondary power source provides secondary power. A power controller provides the primary power to an operating power circuit. The secondary power is provided by enabling a secondary switch located between the secondary power source and the operating power circuit. A solid-state memory uses power from the operating power circuit as a primary source of power when accessing stored data and retains data in the absence of power being provided by the operating power circuit. A memory controller facilitates access to the stored data. In response to problems with the primary power source, pending writes are completed to the solid-state memory circuit. A timing circuit substantially delays full enablement of the secondary switch.

20 Claims, 4 Drawing Sheets

(56) References Cited

U.S. PATENT DOCUMENTS

| | | |
|---|---|---|
| 6,765,371 B2 | 7/2004 | Kataoka |
| 6,788,027 B2 | 9/2004 | Malik |
| 6,838,923 B2 | 1/2005 | Pearson |
| 6,981,161 B2 | 12/2005 | Koo |
| 7,019,583 B2 | 3/2006 | Del Signore, II et al. |
| 7,173,821 B2 | 2/2007 | Coglitore |
| 7,177,222 B2 | 2/2007 | Spengler |
| 7,233,890 B2 | 6/2007 | Shapiro et al. |
| 7,254,742 B2 | 8/2007 | Hayashi |
| 7,268,998 B2 | 9/2007 | Ewing et al. |
| 7,269,755 B2 | 9/2007 | Moshayedi et al. |
| 7,305,572 B1 | 12/2007 | Burroughs et al. |
| 7,310,707 B2 | 12/2007 | Olds et al. |
| 7,318,121 B2 | 1/2008 | Gaertner et al. |
| 7,321,521 B2 | 1/2008 | Spengler |
| 7,334,144 B1 | 2/2008 | Schlumberger |
| 7,404,073 B2 | 7/2008 | Felts |
| 7,404,131 B2 | 7/2008 | McCarthy et al. |
| 7,414,335 B2 | 8/2008 | Hussein et al. |
| 7,487,391 B2 | 2/2009 | Pecone et al. |
| 8,230,257 B2 * | 7/2012 | Wilson ............... 714/14 |
| 2002/0101742 A1 | 8/2002 | Hosotani et al. |
| 2003/0035311 A1 | 2/2003 | Phadke |
| 2003/0184266 A1 * | 10/2003 | Miyazaki ............. 323/222 |
| 2005/0060587 A1 * | 3/2005 | Hwang et al. ........ 713/300 |
| 2005/0088793 A1 * | 4/2005 | Anderson et al. ...... 361/92 |
| 2005/0270927 A1 * | 12/2005 | Hayashi ............. 369/47.1 |
| 2006/0080515 A1 | 4/2006 | Spiers et al. |
| 2006/0132105 A1 * | 6/2006 | Prasad et al. ......... 323/222 |
| 2007/0047100 A1 * | 3/2007 | Takahashi et al. ..... 359/689 |
| 2007/0223870 A1 | 9/2007 | Farling et al. |
| 2008/0007219 A1 | 1/2008 | Williams |
| 2008/0185914 A1 * | 8/2008 | Randall ............... 307/64 |
| 2008/0232144 A1 | 9/2008 | Klein |
| 2009/0006877 A1 | 1/2009 | Lubbers et al. |
| 2010/0253297 A1 | 10/2010 | Tseng |

OTHER PUBLICATIONS

N. Li, J. Zhang, and Y. Zhong, "A Novel Charging Control Scheme for Super Capacitor Energy Storage in Photovoltaic Generation System," DRPT2008 Apr. 6-9, 2008 Nanjing China.

ECNmag.com, "1.2A, 1.6MHz Synchronous Boost Regulator from Linear Technology," Top News, Jan. 8, 2009.

Intel® Mainstream SATA Solid State Drives, "Intel® X25-M and X18-M Mainstream SATA Solid-State Drives".

"Get the Lowdown on Ultracapacitors," Penton Media, Inc., Nov. 15, 2007.

STMicroelectronics, "Regulating Pulse Width Modulators, SG3524," Jul. 2000.

Linear Technology, "1.2A Synchronous Step-up DC/DC Converter with Input Current Limit, LTC3125," 2008.

Keith Curtis. "Replacing Chemical Battery Storage with Supercapacitors into your Embedded Design." EETimes Europe, Texas Instruments. Oct. 28, 2008.

National Semiconductor, 2000. "DS007746", "LM78XX Series Voltage Regulators.".

* cited by examiner

SYSTEMS, METHODS AND DEVICES FOR CONTROLLING BACKUP POWER PROVIDED TO MEMORY DEVICES AND USED FOR STORING OF SENSITIVE DATA

RELATED PATENT DOCUMENTS

This patent document is a continuation under 35 U.S.C. §120 of U.S. patent application Ser. No. 12/632,556 filed on Dec. 7, 2009 (U.S. Pat. No. 8,230,257), which claims the benefit under 35 U.S.C. §119(e) of U.S. Provisional Patent Application No. 61/220,862 filed on Jun. 26, 2009; each of these patent documents is fully incorporated herein by reference.

FIELD OF THE INVENTION

Aspects of the present invention relate to control of backup power that can be particularly useful for controlling the backup power as it is provided to memory devices.

BACKGROUND

Computer systems are generally designed under the premise that accesses to memory are limiting factors in the efficiency of the computer system. Common computer systems are designed to take advantage of fast-cache memory while still allowing for large memory sizes. To provide this advantage computer systems are designed with a memory hierarchy. Generally, the memory hierarchy is implemented using a progression of several levels of memory having increasing storage capacity and decreasing access speeds. Typical components include cache located within the processor die, sometimes referred to as internal cache, externally located cache, random-access memory (RAM) and mass memory storage devices. Other memories include memories used by various peripheral devices and processors, such as graphics adapters, communications adapters and other input/output components. From the perspective of the processor executing a software program, these memories are often hidden in the sense that common data is temporarily cached in smaller and faster memory circuits. This common data is mapped to larger and slower memory circuits, which are accessed when the faster memory does not contain the desired data. The common data, if changed in the cached memory, can eventually be written to the larger and slower memory circuits. This allows for the slow memory access time to be hidden so long as the faster memory contains the appropriately mapped data.

Computer systems generally contain some type of mass-storage memory that is able to retain data when the computer system is powered down. This type of memory is referred to as nonvolatile memory because it is able to maintain data integrity when the computer system is not powered. Nonvolatile memory, however, can be slower by orders of magnitude relative to various volatile memories. Yet, nonvolatile memory can also be less expensive (per unit of memory capacity) and/or less power hungry. A common type of nonvolatile mass-storage memory is a hard disc drive (HDD) that uses a rotating magnetic media. HDDs are used for home-computers, servers, and various other devices. Under normal operation, a computer system transfers sensitive data from temporary memory to a HDD before the computer system is powered down. This allows for the sensitive data to be saved in memory that persists after the power is removed from the computer system. When the computer system is subsequently powered up, this data can be accessed and used by the computer system.

HDDs with rotating magnetic media have been in use for many years and have undergone various improvements including efficiency, reliability and memory capacity. Various applications, however, are beginning to use other types of nonvolatile memory with more frequency. Solid State Devices/Drives (SSDs) are one such alternative nonvolatile memory. SSDs are attractive for many applications because, unlike HDDs, they have no need for moving parts with HDDs. Thus, they are not subject to mechanical wear inherent in HDDs. Another advantage of SSDs over traditional HDDs is that physical movement, e.g., shock or vibration, of the HDD can interrupt accesses to the rotating media. Thus, HDDs often include various mechanisms to compensate for mechanical shocks. Speed, cost and power requirements also factor into the selection of SSDs or HDDs.

While SSDs have their advantages over HDDs, there are a number of reasons why they have not yet completely replaced HDDs with rotating magnetic media. Aspects of the present invention, although not limited thereto, can be appreciated in the context of such mass-memory storage devices.

SUMMARY

The present invention is directed to systems and methods for use with power control features of memory applications in which data integrity is an issue. These and other aspects of the present invention are exemplified in a number of illustrated implementations and applications, some of which are shown in the figures and characterized in the claims section that follows.

Consistent with one embodiment of the present invention, a solid-state memory device is implemented with a primary power source that provides primary power. A secondary power source provides secondary power. A power controller provides the primary power to an operating power circuit. The secondary power is provided by enabling a secondary switch located between the secondary power source and the operating power circuit. A solid-state memory uses power from the operating power circuit as a primary source of power when accessing stored data and retains data in the absence of power being provided by the operating power circuit. A memory controller facilitates access to the stored data. In response to problems with the primary power source, pending writes are completed to the solid-state memory circuit. A timing circuit substantially delays full enablement of the secondary switch.

Consistent with another embodiment of the present invention, a power-backup circuit includes a power input for receiving primary power and a power output providing output power. A primary switch has a primary switch input connected to the power input, a primary switch output connected to the power output, and a primary switch control for enabling a current path between the primary switch input and the primary switch output, thereby providing power to the power output. A secondary power switch has a secondary switch output connected to the power output, a secondary switch input, and a secondary switch control for enabling a current path between the secondary switch input and the secondary switch output, thereby providing power to the power output. A power storage circuit is connected to the secondary switch input and configured and arranged to provide stored power to the secondary switch. A control circuit is configured and arranged to provide a control signal to the secondary switch control signal, the control signal delaying full-enablement of the secondary switch as a function of inrush current caused by the secondary switch.

The above summary is not intended to describe each illustrated embodiment or every implementation of the present invention. The figures and detailed description that follow, including that described in the appended claims, more particularly exemplify these embodiments.

BRIEF DESCRIPTION OF THE DRAWINGS

The invention may be more completely understood in consideration of the detailed description of various embodiments of the invention that follows in connection with the accompanying drawings as follows.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present invention are believed to be useful for enabling backup power sources in memory devices, circuits and systems. A particular application of the present invention relates to solid state devices (SSDs) that provide nonvolatile memory storage alternatives to traditional rotating magnetic media. While the present invention is not necessarily limited to such applications, various aspects of the invention may be appreciated through a discussion of various examples using this context.

An embodiment of the present invention relates to circuits and methods for enabling a backup power source in a memory system. The backup power source is enabled in response to detecting a problem with a primary power source. For example, detection can involve determining that the voltage level of the primary power source has fallen below a threshold level. In response to the detection, the memory system enables the backup power source. This is particularly useful in applications for which the memory system caches data in volatile memory. The integrity of the cached data is threatened by the problems with the primary power source. The system includes a memory controller that writes the cached data to a memory that is not subject to data loss in the absence of power from the primary power source. To facilitate this write procedure, the backup power source provides temporary power to the memory system for a time sufficiently long to complete the write procedure.

Aspects of the present invention recognize that the voltage levels between the backup power source and the primary source might have significant differences. These differences can arise, for example, when the primary voltage is out of an acceptable range and/or when the backup power source provides a different voltage level relative to the primary power source. The differences in voltages can lead to the generation of a voltage spike and to undesirable transient voltage fluctuations. One mechanism for compensating for the voltage differences is to provide capacitive filter circuits to dampen the voltage fluctuations; however, due to the circuit requirements, the capacitive filters can require prohibitively large capacitive values. Accordingly, aspects of the present invention provide an alternative mechanism for compensating for differences between the primary and backup voltage levels.

Consistent with one embodiment of the present invention, a switch is used to enable the backup power source. A timing/delay circuit controls the rate at which the backup power source is enabled. For instance, the amount of current from the backup power source can be limited and gradually increased, thereby compensating for voltage differences between the power sources.

In a particular implementation, a transistor device is used as the switch. The timing/delay circuit gradually modifies the voltage at the gate of the transistor, thereby limiting the effect of the voltage differential between power sources. The timing/delay circuit can be implemented using, a variety of circuits. One such circuit is an RC circuit that responds to an enable signal by gradually modifying the gate voltage of the transistor. For field-effect transistors (FETs), the RC circuit gradually increases the gate-source voltage. Initially, the FET operates in a linear mode, which results in the effective resistance of the FET to gradually decrease. This provides control over the amount of current provided by the backup power source.

The value of the RC circuit is selected to provide sufficiently fast enabling of the backup power source while minimizing transient voltages due to rapid changes in the operating power voltage-level. Further control can be provided by controlling the enable signal. This can include pulsing of the enable signal to slow the charging of the RC circuit. The rate of pulsing and its duty cycle help determine the charge rate for the RC circuit.

A particularly useful application of the present invention relates to Solid State Devices/Drives (SSDs). SSDs operate using semiconductor technology and without the need to use the electrical properties of a vacuum and mechanical action, or moving parts. One type of SSD uses nonvolatile flash memory to store data. Flash memory is often used for handheld devices for which space and/or power requirements are at a premium. Flash memory has the benefit of not being as susceptible to mechanical perturbations. For other applications, SSDs using flash memory are being looked to more and more. It has been recognized that improvements in SSD reliability would facilitate their use in such applications.

HDDs with rotating magnetic media can utilize the kinetic energy from the spindle motor to briefly maintain drive supply voltages in the event of an unexpected power loss. For example, back-electromotive force (EMF) is converted into electrical power and the drive is allowed to write data from a temporary/volatile cache to the nonvolatile rotating magnetic media. This property can be highly-valued in applications where data integrity is of high-import.

SSDs do not have rotating magnetic media, and therefore, data stored in temporary/volatile memory/cache locations can be lost in the event of an unexpected loss of power. To address this issue, a secondary power source can be used in place of back-EMF. This secondary power source provides power to the SSD in the event of unexpected losses of power, thereby allowing for data from a temporary/volatile cache to be written to the nonvolatile SSD memory. Two, non-limiting, examples of secondary power sources include a battery and a capacitor circuit. A controller detects a loss of power from the primary supply and engages the secondary power source. The contents of volatile memory circuits are then transferred to nonvolatile memory circuits. For further details on one example of how to implement such a controller, reference can be made to U.S. Pat. No. 7,269,755 to Moshayedi et al., which is fully incorporated herein by reference.

Both batteries and supercapacitors, also referred to as ultracapacitors, are elements that can be subject to reliability issues. For instance, the power-capabilities of both batteries and capacitors can degrade over time. If the degradation is severe, the power-capabilities of the backup power source may be insufficient to ensure all data is written from the volatile memory circuit during a power-loss event.

Embodiments of the present invention incorporate these and other aspects in various combinations and also as individual components of a device, method or system. While a number of combinations are discussed herein, the present invention is not limited to those combinations that are expressly recited. Rather, the present invention is applicable to a host of different applications and combinations for the various teachings herein.

Figure 1:
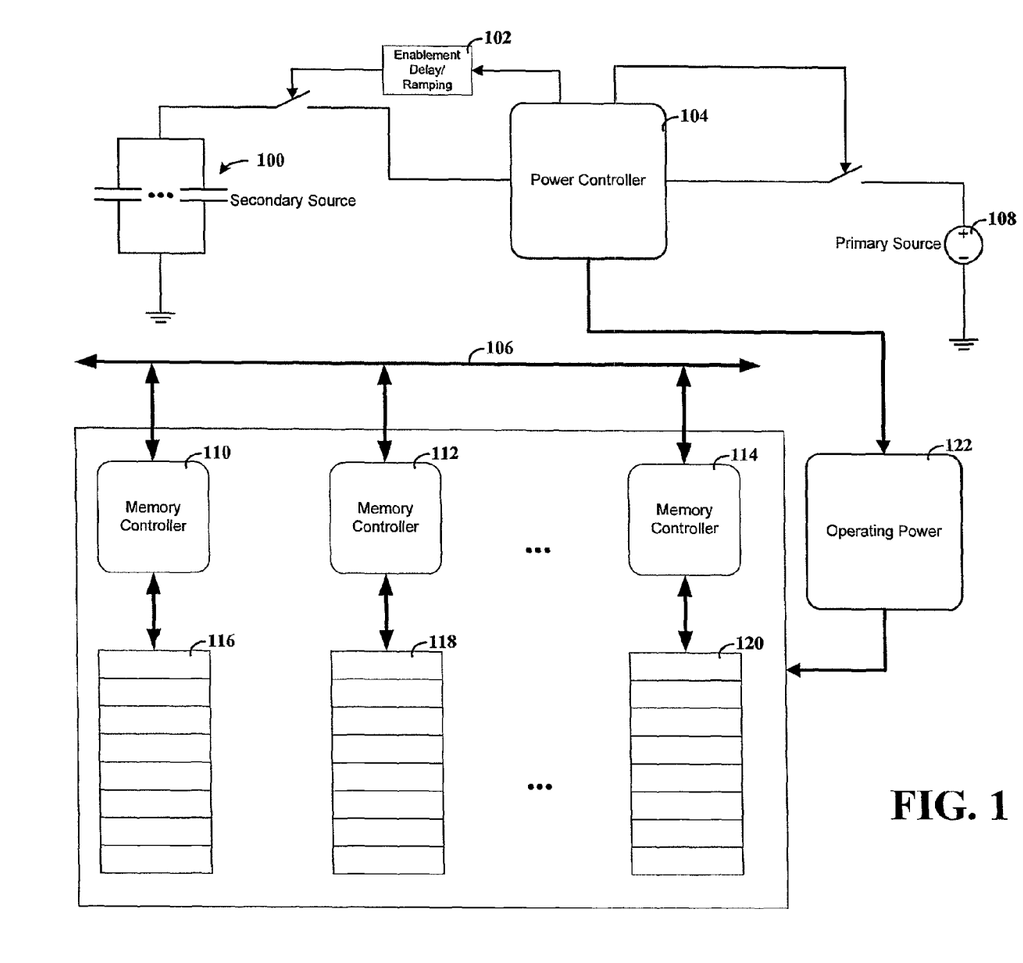
FIG. 1 depicts a system diagram for a memory system having a backup power source, consistent with an example embodiment of the present invention.

FIG. 1 depicts a system diagram for a memory system having a backup power source, consistent with an example embodiment of the present invention. The memory system includes one or more memory controllers 110, 112 and 114. These memory controllers control access to memories 116, 118 and 120. Although not shown, the memory controllers can also control cache memory elements useful for hiding latencies of the memories 116, 118 and 120. Data bus 106 is used to communicate data between the memory controllers and the rest of the system. Primary power source 108 provides operation power 122 to the memory controllers and to the memories.

Power controller 104 controls primary power source 108 and secondary/backup power source 100. For instance, power controller 104 can enable secondary power source 100 in response to issues associated with primary power source 108. In response, the memory controllers can write data stored in volatile memory to non-volatile memory 116, 118 and 120. Other actions can include error logging, power failure notification, firmware status recording, zeroing of RAM (e.g., for security) and periodic writes of hold-up bits. An enablement delay/ramping component 102 is implemented to control the enablement of the backup power source 100. In a specific implementation, the enablement delay/ramping component 102 is implemented using an RC time delay circuit, such as the one depicted in FIG. 3. Variations in the circuit are possible, including those modifications not explicitly shown.

Figure 2:
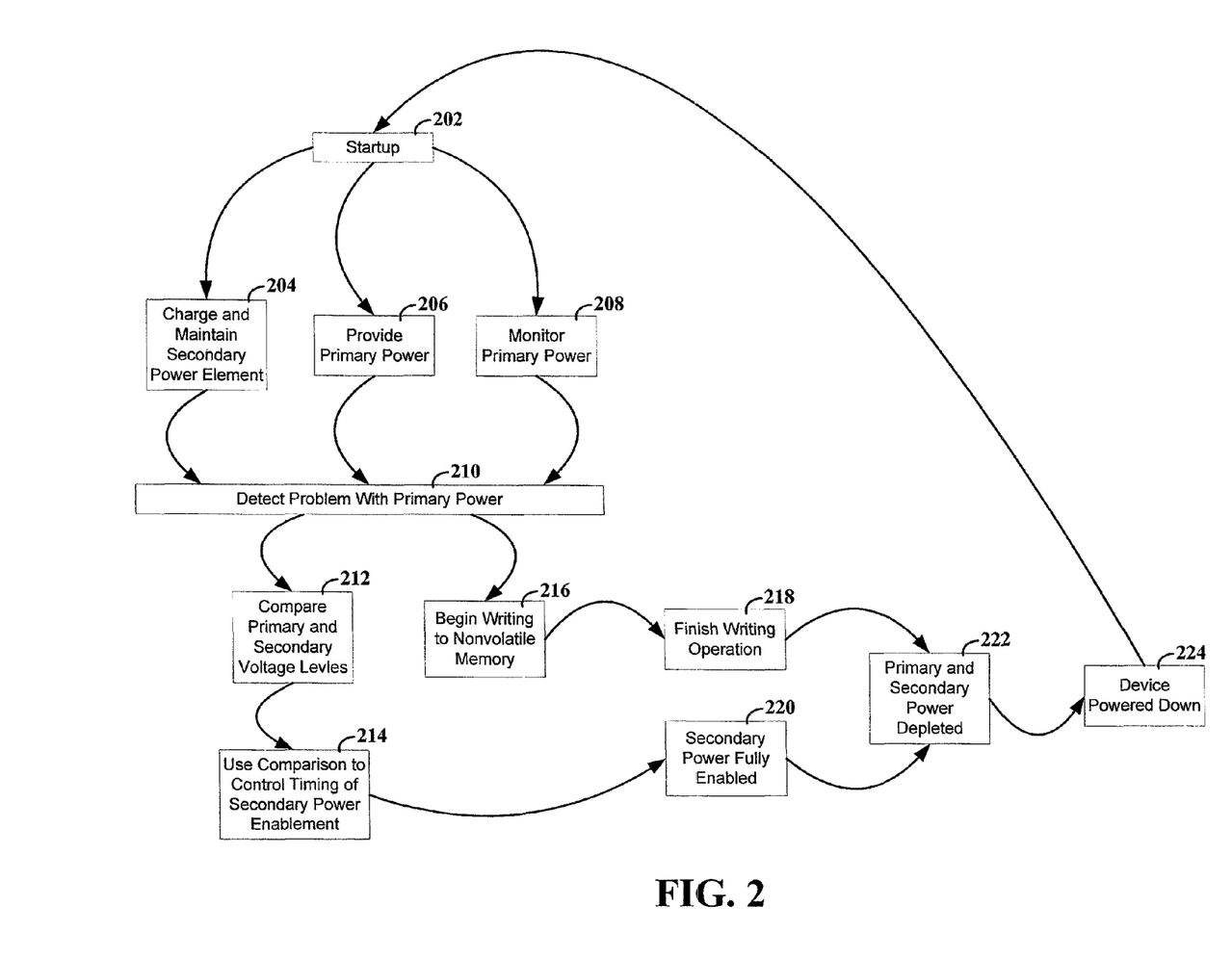
FIG. 2 depicts a flow diagram for use with a memory system having a backup power source, consistent with an example embodiment of the present invention.

FIG. 2 depicts a flow diagram for use with a memory system having a backup power source, consistent with an example embodiment of the present invention. The flow diagram begins with a startup 202, which can represent primary power being supplied to the memory system. Charge on the secondary power element is provided and maintained 204 during normal operation of the device. Primary power is provided 206 to the memory system to allow the system to be initialized and used for memory storage. The primary power is monitored 208 to detect issues with the primary power. If an issue is detected 210 with the primary power, the memory system can perform necessary functionality. This functionality can include writing the contents of volatile memory to a nonvolatile memory device 216. Other functionality is also possible, including error reporting and configuration of the memory system for power-removal. Optionally, a comparison of the voltage differential between the backup power source and the primary power source can be implemented 212. The enabling of the backup power source is controlled 214, which can be optionally implemented as a function of the comparison of the voltage differential. After a delay/ramping period, the backup power source is fully enabled 220. Before the backup power source is depleted 222, the writing and other functionality are completed 218. The device can then be safely powered down 224.

Figure 3:
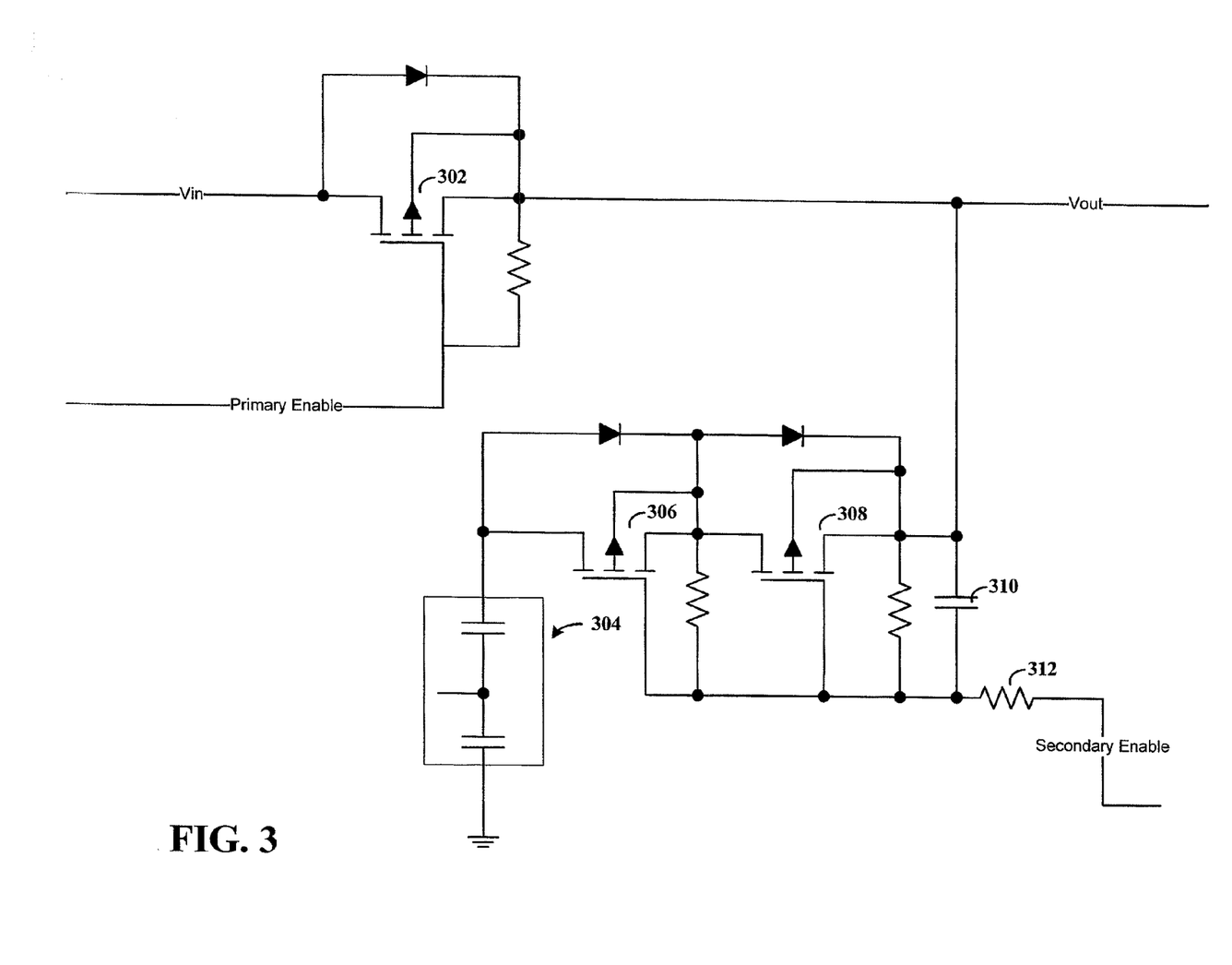
FIG. 3 depicts a circuit diagram for providing controlled switchover to a backup power source, consistent with an example embodiment of the present invention.

FIG. 3 depicts a circuit diagram for providing controlled switchover to a backup power source, consistent with an example embodiment of the present invention. Vin represents input power from a primary power source. Vout represents primary operating power provided to the memory system. FET 302 controls whether Vin is provided to Vout. A power control circuit enables FET 302 using the primary enable signal.

Backup/secondary power source 304 provides backup/secondary power when necessary. FIG. 3 depicts backup power source 304 as a capacitor, however, other implementations are possible including, for instance, a battery. FETs 306 and 308 control whether or not backup power source 304 provides power to Vout by controlling the secondary enable signal. The RC circuit including resistor 312 and capacitor 310 slows the rate at which the gate-source voltage of FETs 306 and 308 is increased. Careful selection of the RC values in relationship with the FET characteristics can be used to provide the desired rate of enablement.

According to one embodiment of the present invention, further control of the rate of enablement can be provided by pulsing the secondary enable signal. In this manner, the charging of the RC circuit is not constant and instead is a function of the ratio of the active time of the signal to the inactive time of the signal. The duty cycle can transition from 100% inactive to 0% inactive over a desired period of time.

In certain embodiments of the present invention, the pulsing rate/duty cycle can be set after testing of the circuit. For instance, the rate of enablement can be monitored during a test procedure and used to determine the pulsing rate. This test can be performed as part of a manufacturing test or upon startup of the device. This can be particularly useful for compensating for manufacturing variations in the RC components and/or the FETs.

Figure 4:
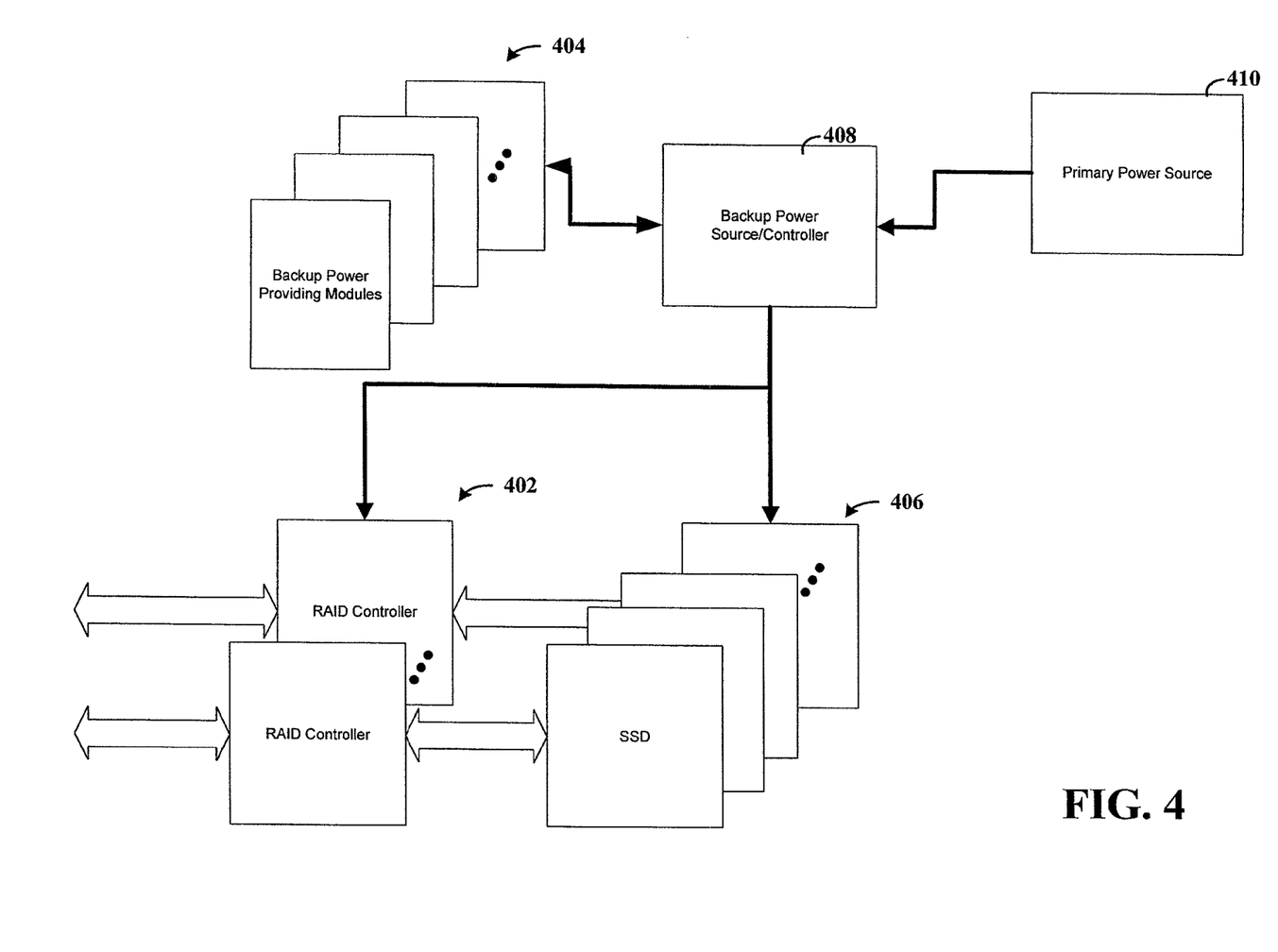
FIG. 4 depicts a system diagram for a redundant-array-of-independent-disks (RAID) controller, consistent with an example embodiment of the present invention.

FIG. 4 depicts a memory device implemented with Redundant Array of Independent Discs (RAID) capabilities, consistent with an embodiment of the present invention. The memory device provides an interface to multiple SSDs 406. Each SSD includes a set of flash memory, a set of cache memory and a memory controller. The RAID functionality can be provided by treating each SSD as an independent disc drive. To the processing system, the memory device will appear to be a set of HDDs configured behind a RAID controller 402. However, the memory device can be configured without being constrained by traditional HDD form factors. In some applications, multiple RAID controllers 402 can be implemented.

RAID and other data-storage schemes provide beneficial storage features by coordinating access to an array of otherwise independent memory devices. Various configurations replicate among multiple memory devices to provide redundancy and reliability. Other configurations divide data between devices, e.g., striping, to improve the data throughput. Combinations of both dividing and replicating are also possible. There are a variety of RAID configurations, and the present invention is not limited to one particular RAID configuration. Future RAID configurations will likely also fall within the scope of the present invention.

In one implementation, primary power source 410 provides power to the memory device during normal operation and a single backup power source 408 is provided for the entire memory device. The backup power source, however, can include multiple power-providing modules 404. These modules each contain a supercapacitor. Instead of providing a power-providing module for each SSD, each power-providing module can be designed for use with multiple SSDs. This can be particularly useful for supercapacitors because, for example, the cost of supercapacitors is not necessarily a one-to-one correlation with the storage capacity. Thus, two larger supercapacitors may be significantly less expensive than four small supercapacitors having the same total power-providing capabilities as the two larger supercapacitors.

The system also provides monitoring to detect or predict failure of a power-providing module. Each module can be designed for removal from the system without interrupting operation of the SSDs in the system. This hot-swappable feature can be facilitated by providing electrical isolation for the module during removal or insertion of the module.

One implementation uses a RAID controller on a first circuit board/card, while the SSDs are on different cards. In this manner, SSDs can be added to the system allowing for more flexibility in design and future upgrades. As additional SSDs are added to the system, it may be necessary to also add additional power-providing modules. The hot-swappable nature of the modules can be particularly useful for this type of upgrades as new modules can be easily inserted by a system operator.

An embodiment of the present invention is applicable to memory systems for which there are two levels of memory. The first level of memory is powered by a primary power supply and is subject to data loss or other data integrity issues in the absence of the primary power supply. In the absence of primary power, the second level of memory has increased data integrity relative to the first level of memory. In this manner, a backup power source can be useful for maintaining power to the first level of memory when a primary power loss occurs. In a specific implementation, the second level of memory could be supplied with a secondary power source that provides the increased data integrity. The concept of multiple memory levels can be applied to a variety of different applications that can benefit from the use of the various aspects of the present invention.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include variations on the delay/ramping circuit. Such modifications and changes do not depart from the true spirit and scope of the present invention, which is set forth in the following claims.

What is claimed is:

1. A power-backup device comprising:
a power input for receiving primary power;
a power output for providing output power;
a primary switch having
a primary switch input connected to the power input,
a primary switch output connected to the power output, and
a primary switch control configured and arranged to enable a current path between the primary switch input and the primary switch output, thereby providing power to the power output;
a secondary switch having
a secondary switch output connected to the power output,
a secondary switch input, and
a secondary switch control configured and arranged to enable a current path between the secondary switch input and the secondary switch output in response to detecting a problem with the primary power, thereby providing power to the power output;
a power storage circuit connected to the secondary switch input and configured and arranged to provide stored power to the secondary switch; and
a control circuit configured and arranged to provide a control signal to the secondary switch control, the control signal generating an increasing voltage level that delays full-enablement of the secondary switch by increasing the voltage level over a period of time, the period of time being responsive to inrush current caused by enabling the secondary switch.

2. The device of claim 1, wherein the control circuit includes a resistive-capacitive circuit for slowing a rising edge of the control signal provided to the secondary switch control as a function of a comparison of a voltage differential between the power storage circuit and the power output.

3. The device of claim 1, wherein the power storage circuit includes at least one supercapacitor for storing the power provided by the secondary switch.

4. The device of claim 1, wherein the power storage circuit includes at least one capacitor for storing the power provided by the secondary switch.

5. The device of claim 1, wherein the control circuit is further configured and arranged to pulse the control signal provided to the secondary switch control according to a duty cycle that is a function of the inrush current caused by charging of the power storage circuit and thereby controlling a rate of the increasing voltage level.

6. The device of claim 1, wherein the primary switch and the secondary switch are transistors and the respective switch controls are gates of the transistors.

7. The device of claim 1, wherein the secondary switch includes one or more field-effect-transistors (FETs) that operate in a linear mode during the delaying of full-enablement, thereby causing an effective resistance of the one or more FETs to gradually decrease.

8. The device of claim 1, wherein the secondary switch control is further configured and arranged to respond to detecting a loss of power in the primary power.

9. The device of claim 1, wherein the secondary switch control is further configured and arranged to respond to detecting a voltage drop in the primary power.

10. The device of claim 1, wherein the control circuit is further configured and arranged to compensate for manufacturing variations in components of the power-backup device in response to a rate of enablement determined during a test procedure.

11. A method of operating a power-backup device, the method comprising:
receiving, at a power input, primary power;
providing, from a power output, output power;
providing power to the power output using a primary switch having
a primary switch input connected to the power input,
a primary switch output connected to the power output, and
a primary switch control configured and arranged to enable a current path between the primary switch input and the primary switch output, thereby providing power to the power output;
enabling a current path between a secondary switch input and a secondary switch output in response to detecting a problem with the primary power using a secondary switch having
  the secondary switch output connected to the power output,
  the secondary switch input, and
  a secondary switch control configured and arranged to enable a current path, thereby providing power to the power output;
providing, using a power storage circuit connected to the secondary switch input, stored power to the secondary switch; and
providing, using a control circuit, a control signal to the secondary switch control, the control signal generating an increasing voltage level that delays full-enablement of the secondary switch by increasing the voltage level over a period of time, the period of time being responsive to inrush current caused by enabling the secondary switch.

12. The method of claim 11, further including the step of slowing, using a resistive-capacitive circuit, a rising edge of the control signal provided to the secondary switch control as a function of a comparison of a voltage differential between the power storage circuit and the power output.

13. The method of claim 11, further including the step of storing the power provided by the secondary switch in at least one supercapacitor.

14. The method of claim 11, further including the step of storing the power provided by the secondary switch in at least one capacitor.

15. The method of claim 11, further including the step of pulsing the control signal provided to the secondary switch control according to a duty cycle that is a function of the inrush current caused by charging of the power storage circuit and thereby controlling a rate of the increasing voltage level.

16. The method of claim 11, wherein the primary switch and the secondary switch are transistors and the respective switch controls are gates of the transistors.

17. The method of claim 11, wherein the secondary switch includes one or more field-effect-transistors (FETs) that operate in a linear mode during the delaying of full-enablement, thereby causing an effective resistance of the one or more FETs to gradually decrease.

18. The method of claim 11, wherein detecting the problem with the primary power includes detecting a loss of power in the primary power.

19. The method of claim 11, wherein detecting the problem with the primary power includes detecting a voltage drop in the primary power.

20. The method of claim 11, further including the steps of determining a rate of enablement during a test procedure and compensating for manufacturing variations in components of the power-backup device in response to the determined rate of enablement.

\* \* \* \* \*